US007148565B2

(12) United States Patent
Kim et al.

(10) Patent No.: US 7,148,565 B2
(45) Date of Patent: Dec. 12, 2006

(54) ETCH STOP LAYER FOR SILICON (SI) VIA ETCH IN THREE-DIMENSIONAL (3-D) WAFER-TO-WAFER VERTICAL STACK

(75) Inventors: Sarah E. Kim, Portland, OR (US); R. Scott List, Beaverton, OR (US); Tom Letson, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/443,831

(22) Filed: May 23, 2003

(65) Prior Publication Data
US 2003/0205824 A1    Nov. 6, 2003

Related U.S. Application Data

(62) Division of application No. 10/077,822, filed on Feb. 20, 2002, now Pat. No. 6,645,832.

(51) Int. Cl.
H01L 23/04 (2006.01)
H01L 23/02 (2006.01)
(52) U.S. Cl. .................. 257/698; 257/686; 257/773
(58) Field of Classification Search ................ 257/698, 257/751, 754, 755, 757, 758, 760, 762, 763, 257/768–770, 773, 774
See application file for complete search history.

(56) References Cited

U.S. PATENT DOCUMENTS 4,803,450 A    2/1989  Burgess et al.
5,753,536 A *  5/1998  Sugiyama et al. .......... 438/108
5,998,292 A * 12/1999  Black et al. ............... 438/618
6,037,668 A    3/2000  Cave et al.
6,265,779 B1 * 7/2001  Grill et al. ................ 257/759
6,448,174 B1   9/2002  Ramm
6,522,002 B1 * 2/2003  Shinkawata ............... 257/757

OTHER PUBLICATIONS

Ultra Thin Electronics for Space Applications. 2001 Electronic Components and Technology Conference, 2001 IEEE.
"Copper Wafer Bonding"; A. Fan, A. Rahman, and R. Reif; Electrochemical and Solid-State Letters, 2 (10) 534-538 (1999).
"Face to Face Wafer Bonding for 3D Chip Stack Fabrication to Shorten Wire Lengths", Jun. 27-29, 2000 VMIC Conference 2000 IMIC—200/00/0090(c).

* cited by examiner

Primary Examiner—Hung Vu
(74) Attorney, Agent, or Firm—Blakely, Sokoloff, Taylor & Zafman LLP

(57) ABSTRACT

A method of forming a silicon (Si) via in vertically stacked wafers is provided with a contact plug extending from selected metallic lines of a top wafer and an etch stop layer formed prior to the contact plug. Such a method comprises selectively etching through the silicon (Si) of the top wafer until stopped by the etch stop layer to form the Si via; depositing an oxide layer to insulate a sidewall of the Si via; forming a barrier layer on the oxide layer and on the bottom of the Si via; and depositing a conduction metal into the Si via to provide electrical connection between active IC devices located on vertically stacked wafers and an external interconnect.

20 Claims, 3 Drawing Sheets

ETCH STOP LAYER FOR SILICON (SI) VIA ETCH IN THREE-DIMENSIONAL (3-D) WAFER-TO-WAFER VERTICAL STACK

CROSS-REFERENCE TO RELATED APPLICATION

This application is a divisional of application Ser. No. 10/077,822, filed Feb. 20, 2002, which issued as U.S. Pat. No. 6,645,832 on Nov. 11, 2003, the contents of which are incorporated herein by reference in their entirety.

TECHNICAL FIELD

The present invention relates to a semiconductor process and, more specifically, relates to a method of using Nickel Silicide (NiSi) as an etch stop layer for the silicon (Si) via etch in vertically stacked wafer processing in a three-dimensional (3-D) wafer-to-wafer vertical stack.

BACKGROUND

Integrated circuits (ICs) form the basis for many electronic systems. Essentially, an integrated circuit (IC) includes a vast number of transistors and other circuit elements that are formed on a single semiconductor wafer or chip and are interconnected to implement a desired function. The complexity of these integrated circuits (ICs) requires the use of an ever increasing number of linked transistors and other circuit elements.

Many modern electronic systems are created through the use of a variety of different integrated circuits; each integrated circuit (IC) performing one or more specific functions. For example, computer systems include at least one microprocessor and a number of memory chips. Conventionally, each of these integrated circuits (ICs) is formed on a separate chip, packaged independently and interconnected on, for example, a printed circuit board (PCB).

As integrated circuit (IC) technology progresses, there is a growing desire for a "system on a chip" in which the functionality of all of the IC devices of the system are packaged together without a conventional PCB. Ideally, a computing system should be fabricated with all the necessary IC devices on a single chip. In practice, however, it is very difficult to implement a truly high-performance "system on a chip" because of vastly different fabrication processes and different manufacturing yields for the logic and memory circuits.

As a compromise, various "system modules" have been introduced that electrically connect and package integrated circuit (IC) devices which are fabricated on the same or on different semiconductor wafers. Initially, system modules have been created by simply stacking two chips, e.g., a logic and memory chip, one on top of the other in an arrangement commonly referred to as chip-on-chip structure. Subsequently, multi-chip module (MCM) technology has been utilized to stack a number of chips on a common substrate to reduce the overall size and weight of the package, which directly translates into reduced system size.

Existing multi-chip module (MCM) technology is known to provide performance enhancements over single chip or chip-on-chip (COC) packaging approaches. For example, when several semiconductor chips are mounted and interconnected on a common substrate through very high density interconnects, higher silicon packaging density and shorter chip-to-chip interconnections can be achieved. In addition, low dielectric constant materials and higher wiring density can also be obtained which lead to the increased system speed and reliability, and the reduced weight, volume, power consumption and heat to be dissipated for the same level of performance. However, MCM approaches still suffer from additional problems, such as bulky package, wire length and wire bonding that gives rise to stray inductances that interfere with the operation of the system module.

An advanced three-dimensional (3D) wafer-to-wafer vertical stack technology has been recently proposed by researchers to realize the ideal high-performance "system on a chip". In contrast to the existing multi-chip module (MCM) technology which seeks to stack multiple chips on a common substrate, 3-D wafer-to-wafer vertical stack technology seeks to achieve the long-awaited goal of vertically stacking many layers of active IC devices such as processors, programmable devices and memory devices inside a single chip to shorten average wire lengths, thereby reducing interconnect RC delay and increasing system performance.

One major challenge of 3-D wafer-to-wafer vertical stack integration technology is the bonding between wafers and between die in a single chip. In general, a dielectric layer is used to bond respective wafers. In the dielectric bonding method, high aspect ratio silicon (Si) via etch is required to provide electrical conductivity between vertically stacked wafers. Therefore, a metal bonding method is preferred to stack wafers. However, existing etch stop layers for silicon (Si) via etch in wafer stacking with metal bonding method can cause oxidation or metal recess which may negatively impact the power delivery system. Therefore, a need exists for an improved etch stop layer for the Si via etch in vertically stacked wafer processing (i.e., 3-D interconnect processing) which provides electrical conductivity between vertically stacked wafers.

BRIEF DESCRIPTION OF THE DRAWINGS

A more complete appreciation of exemplary embodiments of the present invention, and many of the attendant advantages of the present invention, will become readily apparent as the same becomes better understood by reference to the following detailed description when considered in conjunction with the accompanying drawings in which like reference symbols indicate the same or similar components, wherein.

DETAILED DESCRIPTION

The present invention is applicable for use with all types of semiconductor wafers and integrated circuit (IC) devices, including, for example, MOS transistors, CMOS devices, MOSFETs, and new memory devices and communication devices such as smart card, cellular phone, electronic tags, gaming devices which may become available as semiconductor technology develops in the future. However, for the sake of simplicity, discussions will concentrate mainly on exemplary use of a simple three-dimensional (3-D) wafer-to-wafer vertical stack and an etch stop layer for metallic wafer-to-wafer and die-to-die bonding in such a three-dimensional (3-D) wafer-to-wafer vertical stack, although the scope of the present invention is not limited thereto.

Figure 1:
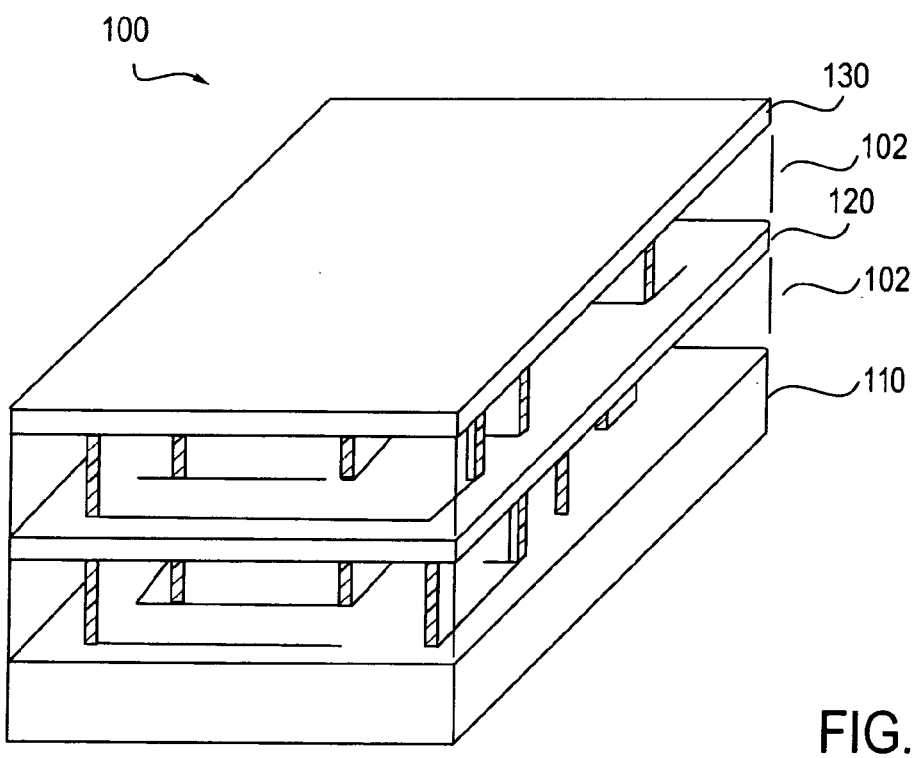
FIG. 1 illustrates an example three-dimensional (3-D) wafer-to-wafer vertical stack forming a single chip.

Attention now is directed to the drawings and particularly to FIG. 1, an example three-dimensional (3-D) wafer-to-wafer vertical stack is illustrated. As shown in FIG. 1, the 3-D vertical stack (chip) 100 may comprise any number of active device polysilicon (Si) wafers, such as wafer #1 110 including, for example, one or more microprocessors; wafer #2 120 including one or more memory devices; and wafer #3 130 including one or more radio-frequency (RF) or optical communication devices. The bottom wafer 110 is typically thick to support the stacking of the top wafers 120 and 130, while the top wafers 120 and 130 are thinned to minimize interconnection lengths between wafers 110, 120 and 130.

In a typical 3-D vertical stack 100 shown in FIG. 1, the active device wafers 110, 120 and 130 are bonded using a dielectric layer 102, while all active layers on wafers 110, 120 and 130 are electrically connected using interwafer vias 104. However, the dielectric layer 102 can be cost-prohibitive for mass production. In addition, the interwafer vias 104 between adjacent wafers 110, 120 and 130 can be lengthy which can lead to interconnect RC delays in active IC devices.

As a result, a metal to metal bond can be used to stack wafers 110, 120 and 130 to form the vertical stack 100 shown in FIG. 1. This metal to metal bond method can serve not only as electrical connections to active IC devices on the vertically stacked wafers 110, 120 and 130 on a 3-D wafer-to-wafer vertical stack 100 but also bond adjacent wafers 110, 120 and 130. Dummy metal bonding pads can also be made to increase the surface area for wafer bonding and serve as auxiliary structures such as ground planes or heat conduits for the active IC devices. In addition, improved etch stop layers for the Si via etch can be used in vertically stacked wafer processing (i.e., 3-D interconnect processing) which provide more efficient electrical conductivity between vertically stacked wafers 110, 120 and 130.

Figure 2:
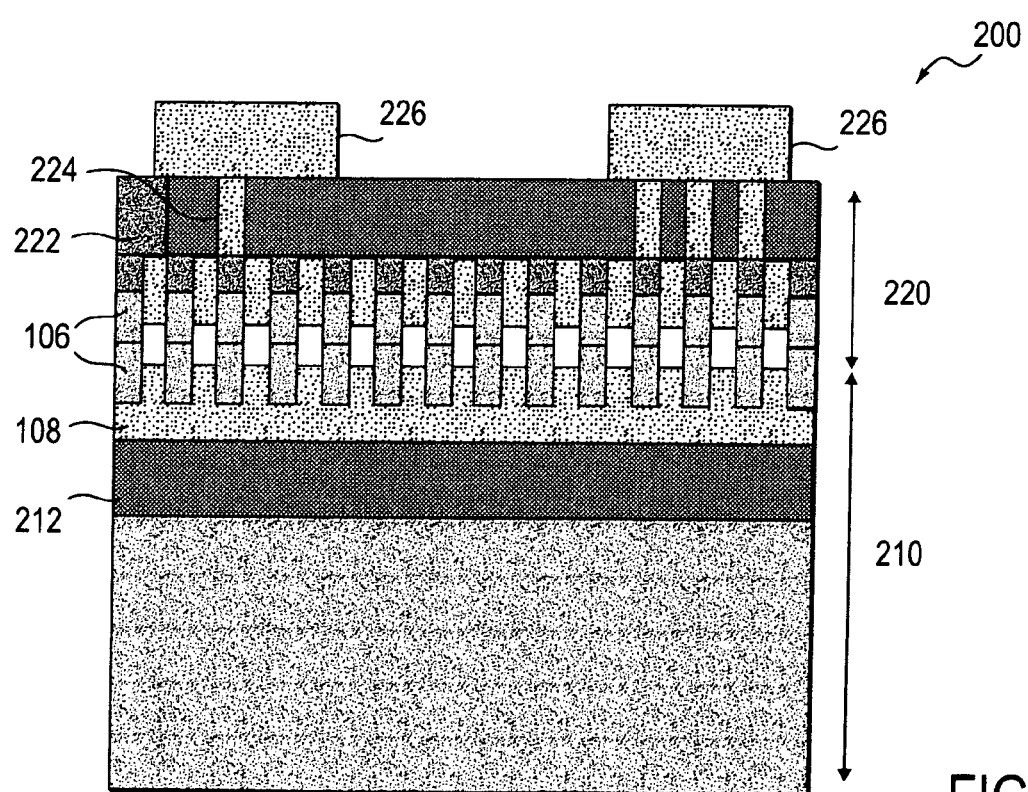
FIG. 2 illustrates an example three-dimensional (3-D) wafer-to-wafer vertical stack according to an embodiment of the present invention.

Turning now to FIG. 2, an example three-dimensional (3-D) wafer-to-wafer vertical stack according to an embodiment of the present invention is illustrated. Specifically, FIG. 2 illustrates an example 2-wafer vertical stack 200 according to an embodiment of the present invention. However, the number of wafers in a vertical stack is not limited thereto. Through 3-D interconnect structure, wiring between vertically stacked wafers can be shortened resulting in a faster signal and minimal interconnect RC delays. In addition, the vertical stack can effectively integrate diverse process technologies on a single wafer process, such as, for example, logic/memory stacking, processor stacking, optical interconnect, system-on-chip, and RF interconnect.

As shown in FIG. 2, the bottom silicon (Si) wafer 210 contains an active device layer 212 supporting one or more active IC devices (not shown). Likewise, the top Si wafer 220 also contains an active device layer 222 supporting one or more active IC devices (not shown). The wafers 210 and 220 may be aligned using a standard alignment tool and bonded, via a metal bonding layer 106 deposited on opposing surfaces of the bottom wafer 210 and the top wafer 220 at designated bonding areas to establish electrical connections between active IC devices on vertically stacked wafers 210 and 220 and to bond adjacent wafers 210 and 220, while maintaining electrical isolation between bonding areas via an ILD layer 108. The top wafer 220 can also be thinned by either a Chemical Mechanical Polish (CMP), grinding, or Silicon (Si) wet etch process so as to be much more pliable than those of standard thickness and to allow for greater thickness variations across the vertically stacked wafers 210 and 220 for the same applied bonding pressure.

In the example 2-wafer vertical stack 200 shown in FIG. 2, the metal bonding process between adjacent wafers 210 and 220 may be performed in a vacuum or an inert gas environment, and a dielectric recess can be made surrounding the metal bonding areas to facilitate direct metal bonding between adjacent wafers 210 and 220 to ensure that the adjacent wafers 210 and 220 are bonded, while maintaining electrical isolation between the metal bonding areas. The metal bonding layer 106 may include a plurality of Copper (Cu) lines on opposing surfaces of the vertically stacked wafers 210 and 220 that can be used for metal diffusion bonding and serve as electrical contacts between active IC devices on the vertically stacked wafers 210 and 220. Copper (Cu) may be selected because of its low electrical resistivity, high electro-migration resistance and high diffusivity. However, other metallic materials can also be used, including, for example, tin, indium, gold, nickel, silver, palladium, palladium-nickel alloy, titanium, or any combination thereof.

After the wafer bonding and silicon (Si) thinning processes are completed, one or more interwafer vias 224 may be etched, via the top wafer 220, to establish electrical connections of active IC devices between vertically stacked wafers 210 and 220 and an external interconnect, via a C4 bump 226. Typically a tungsten "W" plug (metal contact layer) is formed during a standard W contact process to establish an interconnect with the copper (Cu) lines (the metal bonding layer 106) of the vertically stacked wafers 210 and 220. The "W" plug may then serve as an etch stop to stop the silicon (Si) via etch. In addition, existing barrier layers such as TaN/Ta (Tantalum Nitride/Tantalum), which form a barrier layer for the copper (Cu) interconnect, or TiN/Ti (Titanium Nitride/Titanium), which form an adhesion layer for the W plug, can be used to stop the silicon (Si) via etch during the Si via etching process. However, both the TaN/Ta and the TiN/Ti layers do not constitute a good etch stop layer because Si etch chemistry can easily etch them. As a result, the W plug can be recessed and Cu lines can be oxidized, which may negatively impact the power delivery system. Accordingly, NiSi (Nickel Silicide) has been advantageously utilized to serve as an etch stop layer for Si via etch in the vertically stacked wafers 210 and 220 to provide electrical conductivity between vertically stacked wafers 210 and 220. NiSi (Nickel Silicide) may be selected because of its high selectivity with the Si via etch and its low resistance to prevent any negative impact on the power delivery system. A several micron deep Si via etch can stop at a thin NiSi etch stop layer very easily. Another advantage of using NiSi as an etch stop layer is that, if NiSi is used as a Silicide material in transistors of IC active devices, then no additional process steps are required to form a NiSi layer.

Figure 3:
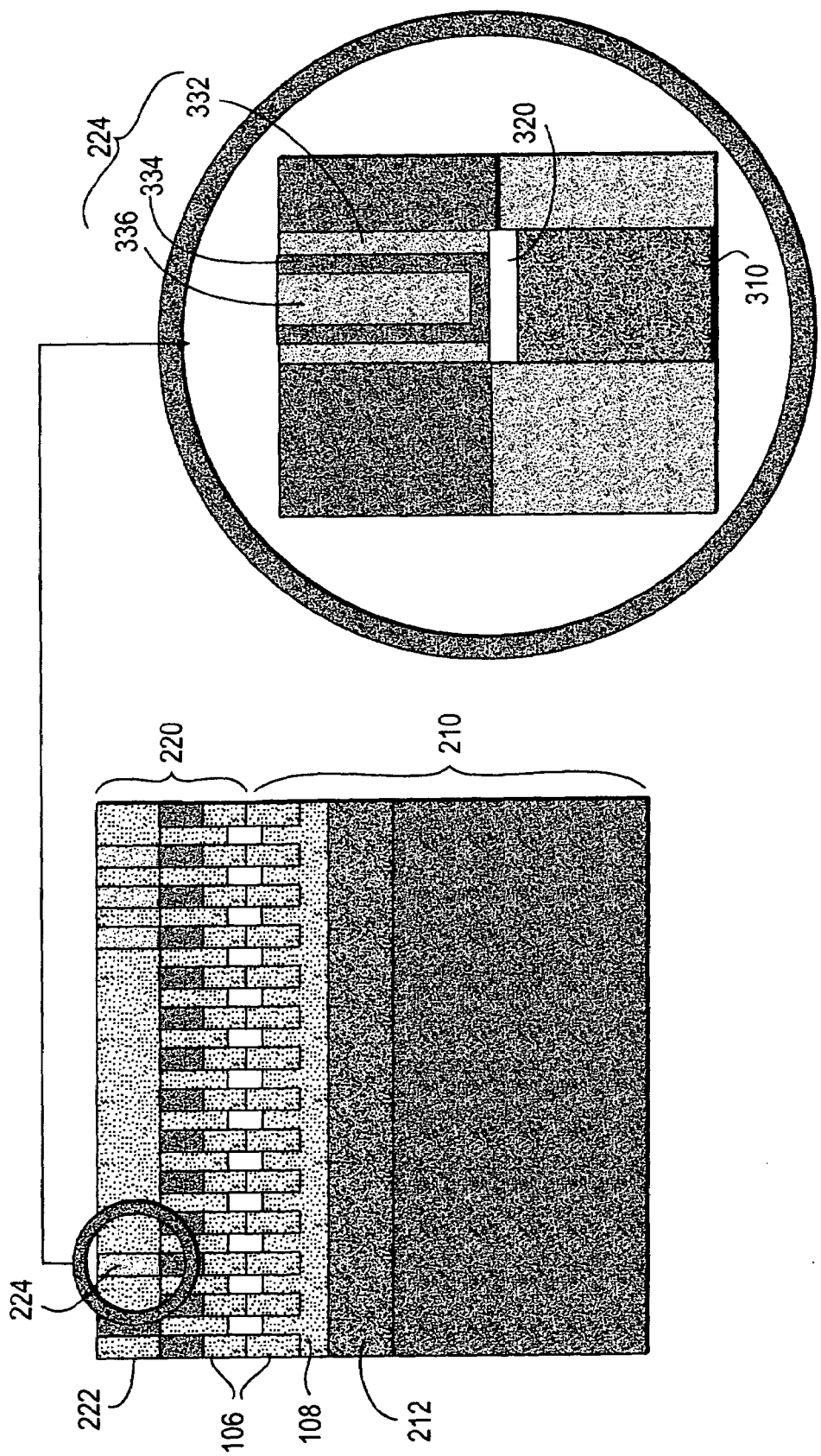
FIG. 3 illustrates an example silicon (Si) via etch in an example three-dimensional (3-D) wafer-to-wafer vertical stack according to an embodiment of the present invention.

Turning now to FIG. 3, an example silicon (Si) via etch in an example three-dimensional (3-D) wafer-to-wafer vertical stack 200 according to an embodiment of the present invention is illustrated. As shown in FIG. 3, a tungsten "W" contact plug 310 is formed during a standard W contact process. A nickel silicide (NiSi) etch stop layer 320 is formed before the W contact plug 310 is established and before the wafers 210 and 220 are bonded. The Si via etch can be stopped at the NiSi etch stop layer 320 to prevent etching through the W contact plug 310. Each of the interwafer vias 224 may contain an oxide layer 332 deposited on a sidewall, a copper (Cu) barrier/seed 334 deposited on the oxide layer 332 and the NiSi etch stop layer 320, and copper (Cu) 336 electroplated on the Si via 224 to serve as an electrical connection between active IC devices located on the vertically stacked wafers 210 and 220 and an external interconnect.

Figure 4:
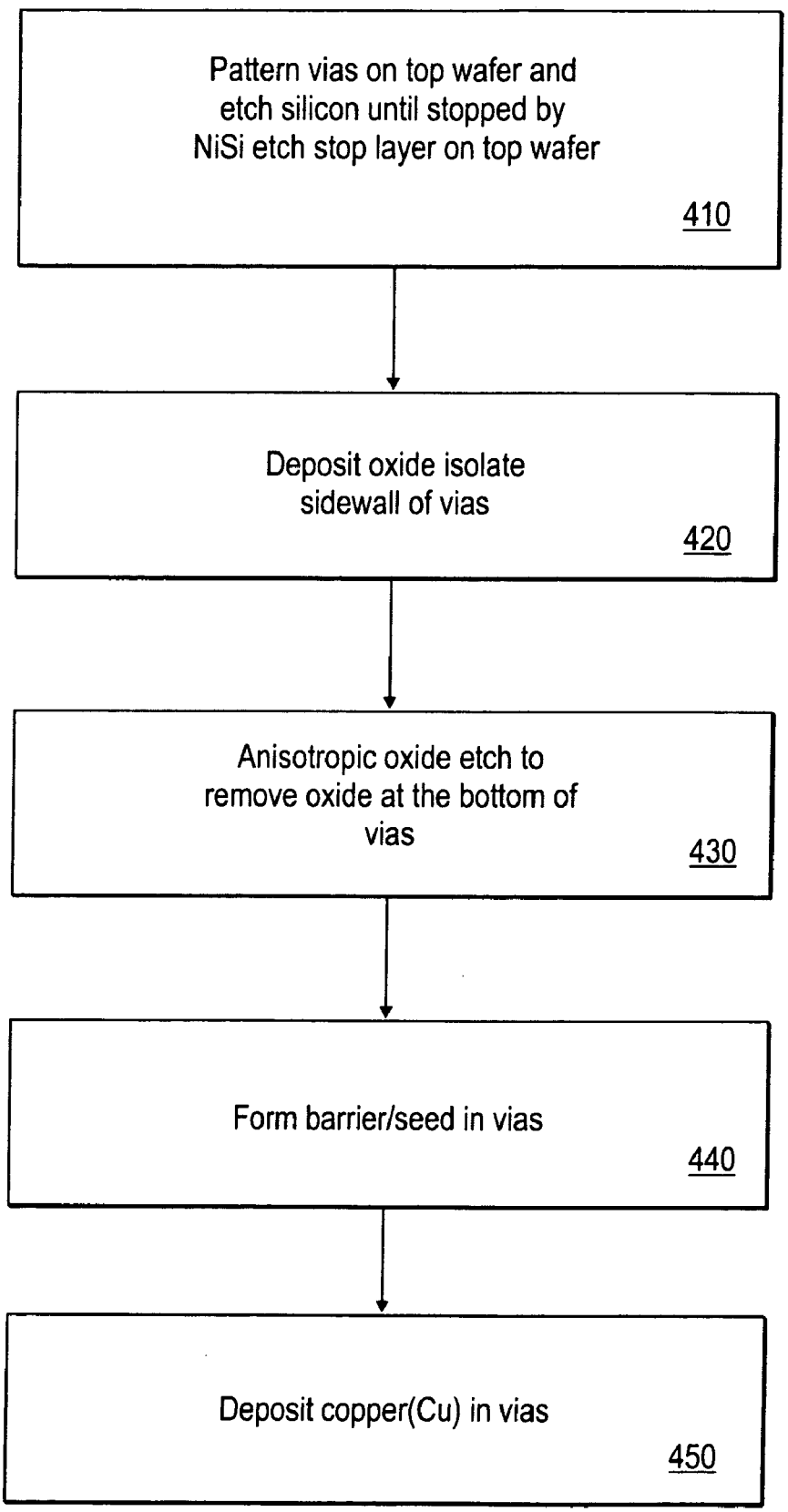
FIG. 4 illustrates an example process of forming one or more silicon (Si) vias in an example three-dimensional (3-D) wafer-to-wafer vertical stack according to an embodiment of the present invention.

FIG. 4 illustrates an example process of forming one or more silicon (Si) vias in an example three-dimensional (3-D) wafer-to-wafer vertical stack according to an embodiment of the present invention. After the tungsten "W" contact plug 310 and NiSi etch stop layer 320 are formed at the top Si wafer 220, and the wafer-to-wafer bonding and silicon (Si) thinning processes are completed, interwafer vias 224 (see FIGS. 2–3) are patterned by conventional lithography and the silicon (Si) is etched using an etch mask until stopped by the NiSi etch stop layer 320 at block 410. After the interwafer vias 224 are etched, an oxide layer 332 as shown in FIG. 3 can be deposited in the Si vias 224 at block 420. Then anisotropic oxide etch is done to remove the oxide at the bottom of the Si vias 224 at block 430. After the anisotropic oxide etch, a barrier/seed layer 334 is then deposited on the oxide layer 332 and the bottom of the Si vias 224 at block 440. After the barrier/seed layer 334, copper (Cu) can then be deposited in the Si vias 224, via electroplating and Chemical Mechanical Polish (CMP), to establish electrical connections between active IC devices located on the vertically stacked wafers 210 and 220 and an external interconnect, via the C4 bump 226 shown in FIG. 2.

As described in this invention, the NiSi etch stop layer according to an embodiment of the present invention can effectively enable the silicon (Si) via etch to provide electrical conductivity between vertically stacked wafers without undesirable copper (Cu) oxidation or tungsten recess. If NiSi is already used as a silicide material in transistors of IC active devices, then no additional process steps may be required to form NiSi. The existing silicide material can be effectively used as an etch stop during the formation of one or more interwafer vias.

While there have been illustrated and described what are considered to be exemplary embodiments of the present invention, it will be understood by those skilled in the art and as technology develops that various changes and modifications may be made, and equivalents may be substituted for elements thereof without departing from the true scope of the present invention. For example, other types of metallic materials that exhibit a high selectivity with the silicon (Si) via etch may also be used in lieu of NiSi (Nickel Silicide) to serve as an etch stop layer. Many modifications may be made to adapt the teachings of the present invention to a particular situation without departing from the scope thereof. Therefore, it is intended that the present invention not be limited to the various exemplary embodiments disclosed, but that the present invention includes all embodiments falling within the scope of the appended claims.

What is claimed is:

1. A three-dimensional (3-D) vertically stacked wafer structure, comprising:
   a first wafer including an active device layer comprised of silicon to support one or more integrated circuit (IC) devices;
   a second wafer including an active layer to support one or more integrated circuit (IC) devices;
   metallic lines deposited on opposing surfaces of the first and second wafers at designated areas to establish metal bonding between the first and second wafers in a stack and electrical connections between active IC devices on the first and second wafers in the stack; and
   one or more interwafer vias formed within the first wafer through the silicon active device layer, to provide electrical connections between active IC devices on the first and second wafers in the stack and an external interconnect,
   wherein each of the interwafer vias comprises:
      a contact plug in contact with selected metallic lines of the first wafer;
      an etch stop layer selective to a silicon etch at an end of the via formed through the silicon active device layer, adjacent the contact plug;
      an oxide layer deposited to insulate a sidewall of the via; and
      a barrier layer and a conduction metal deposited in the via to provide electrical connection between active IC devices on the first and second wafers in the stack and the external interconnect.

2. The three-dimensional (3-D) vertically stacked wafer structure as claimed in claim 1, wherein the metallic lines include copper (Cu) lines deposited on opposing surfaces of the first and second wafers to serve as electrical contacts between active IC devices on the first and second wafers.

3. The three-dimensional (3-D) vertically stacked wafer structure as claimed in claim 1, wherein the contact plug is comprised of tungsten (W).

4. The three-dimensional (3-D) vertically stacked wafer structure as claimed in claim 1, wherein the etch stop layer is comprised of nickel silicide (NiSi).

5. The three-dimensional (3-D) vertically stacked wafer structure as claimed in claim 1, wherein the conduction metal deposited in the interwafer vias is comprised of copper (Cu).

6. The three-dimensional (3-D) vertically stacked wafer structure as claimed in claim 1, wherein each of the interwafer vias is formed by:
   selectively etching through the first wafer until stopped by the etch stop layer;
   depositing the oxide layer to insulate a sidewall of the interwafer via;
   depositing the barrier layer on the oxide layer and on the bottom of the interwafer via; and
   filling the interwafer via with the conduction metal to provide electrical connections between active IC devices on the first and second wafers in the stack and the external interconnect.

7. A vertically stacked wafer structure, comprising:
   a first wafer including a silicon active device layer to support one or more integrated circuit (IC) devices;
   a second wafer including an active layer to support one or more integrated circuit (IC) devices;
   metallic lines deposited on opposing surfaces of the first and second wafers at designated areas to establish metal bonding between the first and second wafers in a stack and electrical connections between active IC devices on the first and second wafers in the stack; and
   one or more interwafer vias formed within the first wafer through the silicon active device layer, to provide electrical connections between active IC devices on the first and second wafers in the stack and an external interconnect,
   wherein each interwafer via comprises:
      an etch stop layer selective to a silicon etch comprised of nickel silicide (NiSi) at a bottom of the interwafer via formed through the silicon active device layer;
      an oxide layer to insulate a sidewall of the interwafer via;

a barrier layer deposited on the oxide layer and on the bottom of the interwafer via; and a conduction metal filled in the interwafer via, to provide electrical connections between active IC devices on the first and second wafers in the stack and the external interconnect.

8. The vertically stacked wafer structure as claimed in claim 7, wherein the metallic lines include copper (Cu) lines deposited on opposing surfaces of the first and second wafers to serve as electrical contacts between active IC devices on the first and second wafers.

9. The vertically stacked wafer structure as claimed in claim 7, wherein the conduction metal deposited in the interwafer vias is comprised of copper (Cu).

10. The vertically stacked wafer structure as claimed in claim 7, wherein the etch stop layer comprised of nickel silicide (NiSi) is formed or deposited in designated areas along with a contact plug before the metallic lines are selectively deposited on the first wafer.

11. A via in a three-dimensional (3-D) wafer structure having vertically stacked wafers and a contact plug extending from selected metallic lines of a top wafer, the 3-D wafer structure comprising:

an etch stop layer selective to a silicon etch comprised of nickel silicide (NiSi) formed at a bottom of the via formed through a silicon active device layer of the top wafer;

an oxide layer deposited on the etch stop layer, to insulate a sidewall of the via;

a barrier layer deposited on the oxide layer and on the bottom of the via; and a conduction metal filled in the via, to provide electrical connections between active IC devices on the vertically stacked wafers and an external interconnect.

12. The via as claimed in claim 11, wherein each of the vertically stacked wafers contains an active layer supporting one or more active IC devices.

13. The via as claimed in claim 11, wherein the vertically stacked wafers are bonded via respective metallic lines which serve as electrical contacts between active IC devices on the vertically stacked wafers.

14. The via as claimed in claim 11, wherein the etch stop layer is formed or deposited on designated areas along with a contact plug before the metallic lines are selectively deposited on the top wafer.

15. The via as claimed in claim 11, wherein the selected metallic lines are copper (Cu) lines deposited to serve as electrical contacts between active IC devices on the vertically stacked wafers.

16. The via as claimed in claim 11, wherein the contact plug is comprised of tungsten (W).

17. The via as claimed in claim 11, wherein the conduction metal deposited in the Si via is comprised of copper (Cu).

18. A stacked wafer structure comprising:

a bottom wafer including a bottom silicon layer, a bottom insulating layer superjacent the bottom silicon layer, and a bottom metal bonding layer superjacent the bottom insulating layer;

a top wafer including a top metal bonding layer bonded to the bottom metal bonding layer, a top insulating layer superjacent the top metal bonding layer, and a top silicon active device layer superjacent the top insulating layer, wherein the top wafer further includes:

a silicide etch stop layer formed at a junction between the top insulating layer and the top silicon active device layer; and a contact plug formed in the top insulating layer subjacent the silicide etch stop layer and superjacent the top metal bonding layer;

a via formed through the top silicon active device layer ending at the silicide etch stop layer;

an oxide layer formed adjacent sidewalls of the via;

a barrier layer formed adjacent the oxide layer and superjacent the suicide layer; and a conductive layer formed adjacent the barrier layer adjacent the oxide layer and superjacent the barrier layer superjacent the silicide layer, the conductive layer electrically connecting active devices in the bottom and top wafers to an external interconnect.

19. The structure of claim 18, wherein the bottom wafer active devices are associated with a first system and the top wafer active devices are associated with a second system, the systems differing and each selected from the group consisting of: a logic system, a memory system, and a communications system.

20. The structure of claim 18, wherein the etch stop layer is comprised of nickel silicide (NiSi) and the top wafer active devices include a transistor including the nickel silicide.

* * * * *